(12) United States Patent
Trivedi et al.

(10) Patent No.: US 6,613,617 B2
(45) Date of Patent: Sep. 2, 2003

(54) CROSS-DIFFUSION RESISTANT DUAL-POLYCIDE SEMICONDUCTOR STRUCTURE AND METHOD

(75) Inventors: Jigish D. Trivedi, Boise, ID (US); Zhongze Wang, Boise, ID (US); Todd R. Abbott, Boise, ID (US); Chih-Chen Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/282,420

(22) Filed: Oct. 28, 2002

(65) Prior Publication Data

US 2003/0057453 A1 Mar. 27, 2003

Related U.S. Application Data

(62) Division of application No. 09/945,380, filed on Aug. 31, 2001.

(51) Int. Cl.[7] ................................................. H01L 21/84
(52) U.S. Cl. ...................... 438/157; 438/176; 438/257; 438/283
(58) Field of Search .................................. 438/157, 176, 438/257, 283; 257/393, 903, 904

(56) References Cited

U.S. PATENT DOCUMENTS

| | | | | |
|---|---|---|---|---|
| 6,118,158 | A | 9/2000 | Kim | 257/369 |
| 6,261,885 | B1 * | 7/2001 | Cheek et al. | 438/199 |
| 6,333,527 | B2 | 12/2001 | Kim | 257/288 |
| 6,404,023 | B1 | 6/2002 | Mori et al. | 257/393 |
| 6,528,401 | B2 * | 3/2003 | Bae et al. | 438/592 |

* cited by examiner

Primary Examiner—Hoai Ho
Assistant Examiner—Long Tran
(74) Attorney, Agent, or Firm—Dorsey & Whitney LLP

(57) ABSTRACT

A dual-polycide semiconductor structure and method for forming the same having reduced dopant cross-diffusion. A conductive layer is formed over a polysilicon layer having a first region doped with a first dopant and a second region adjoining the first region at an interface doped with a second dopant. A region of discontinuity is then formed in the conductive layer located away from the interface. The conductive layer formed over the polysilicon gate overlaps the interface to provide electrical continuity between the first and second regions of the polysilicon gate, but also includes a region of discontinuity to reduce dopant cross-diffusion.

21 Claims, 7 Drawing Sheets

CROSS-DIFFUSION RESISTANT DUAL-POLYCIDE SEMICONDUCTOR STRUCTURE AND METHOD

CROSS-REFERENCE TO RELATED APPLICATION

This application is a divisional of pending U.S. patent application Ser. No. 09/945,380, filed Aug. 31, 2001.

TECHNICAL FIELD

The present invention relates generally to integrated circuits, and more specifically, to a structure and a method for forming a dual-polycide semiconductor structure in an integrated circuit.

BACKGROUND OF THE INVENTION

It is generally accepted that it is desirable to have integrated circuits that are smaller and more power efficient. This is true with respect to many semiconductor devices. For example, with memory devices, having smaller memory cell sizes allows for greater memory density, and consequently, storage of more data in a similar sized device. Similarly, microprocessors having greater transistor density, that is, a smaller transistor feature size, generally have more computing power available. Thus, because of the advantages provided by smaller semiconductor devices, a significant amount of resources have been directed to developing fabrication methods, semiconductor structures, and fabrication and processing equipment to construct smaller devices.

In an effort to minimize the size of a semiconductor structure and reduce the number of processing steps, such as in a static random access memory (SRAM) cell, dual-polycide gate structures having a first portion doped with n-type impurities and second portion doped with p-type impurities are used for the gates of the transistors of the memory cells. Dual-polycide gate structures enable the gates of a CMOS inverter to be formed without performing the processing steps typically required in forming each of the gates of the NMOS and PMOS transistors separately. Moreover, using one polycide structure to form the gates for both the NMOS and PMOS transistors of a CMOS inverter requires less space than having two physically separate gates.

A schematic drawing of a conventional 6T SRAM cell is provided in FIG. 1a, and an example of a mask layout for the 6T SRAM cell is provided in FIG. 1b. As the cross-sectional view of FIG. 1c illustrates, a dual-polycide gate 100 includes a polysilicon layer 110 having a first region 112 doped with n-type impurities and a second region 114 doped with p-type impurities. The gate 100 further includes a silicide strap layer 116, typically formed from tungsten silicide, that provides a relatively low resistance current path between the first region 112 and the second region 114. Without the silicide strap layer 116, the junction between the first and second regions 112 and 114 would behave like a pn-diode, which would be unacceptable in the present application.

A problem, however, with using dual-polycide gate structures, such as the one illustrated in FIG. 1c, is cross-diffusion of dopants between the first and second regions 112 and 114 through the silicide strap layer 116. It is well known that certain dopants, such as Arsenic, move relatively easily in silicides, such as tungsten silicide. For example, arsenic from the n-poly of the first region 112 migrates into the silicide strap layer 116 and cross-diffuses into the p-poly of the second region 114. Cross-diffusion causes polysilicon depletion, that is, the polysilicon no longer behaves like metal electrodes. This consequently leads to adverse effects such as gate threshold voltage shift and lower drive capability.

One approach that has been taken to address the issues of cross-diffusion in a polycide gate has been to form separate gates for the different transistors. Physically separating the gates of the different transistors assures that cross-diffusion of dopants cannot take place. This approach typically requires that separate contacts are formed to electrically connect to each of the gates. However, as previously mentioned, increasing the memory cell size to accommodate the additional contacts is typically undesirable, and in some instances, the memory cell design rule limits may not allow for the use of separate contacts. Therefore, there is a need for a dual-polycide semiconductor structure and a method that reduces cross-diffusion of dopants across the dopant boundary.

SUMMARY OF THE INVENTION

Embodiments of the present invention are directed to a dual-polycide semiconductor structure and method for forming the same having reduced dopant cross-diffusion. In a semiconductor structure that includes a polysilicon layer having a first region that is doped with a first dopant and a second region adjoining the first region at an interface that is doped with a second dopant, embodiments of the present invention include forming a conductive layer over the polysilicon layer that overlaps the interface, and then removing a portion of the conductive layer to form a region of discontinuity located at a minimum distance away from the interface. Thus, the conductive layer formed over the polysilicon gate overlaps the interface to provide a low resistance current path between the first and second regions of the polysilicon gate, but also includes a region of discontinuity to reduce dopant cross-diffusion from one region to the other.

DETAILED DESCRIPTION OF THE INVENTION

Figure 2A:
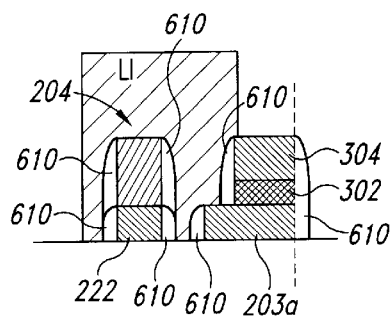
FIGS. 2a–2c are cross-sectional drawings of a SRAM cell including embodiments of the present invention, and a corresponding layout drawing.
Figure 2B:
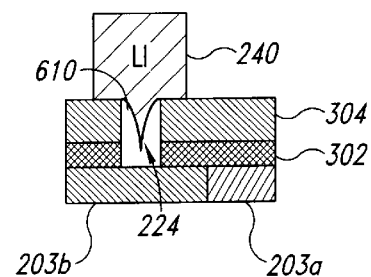
Figure 2C:
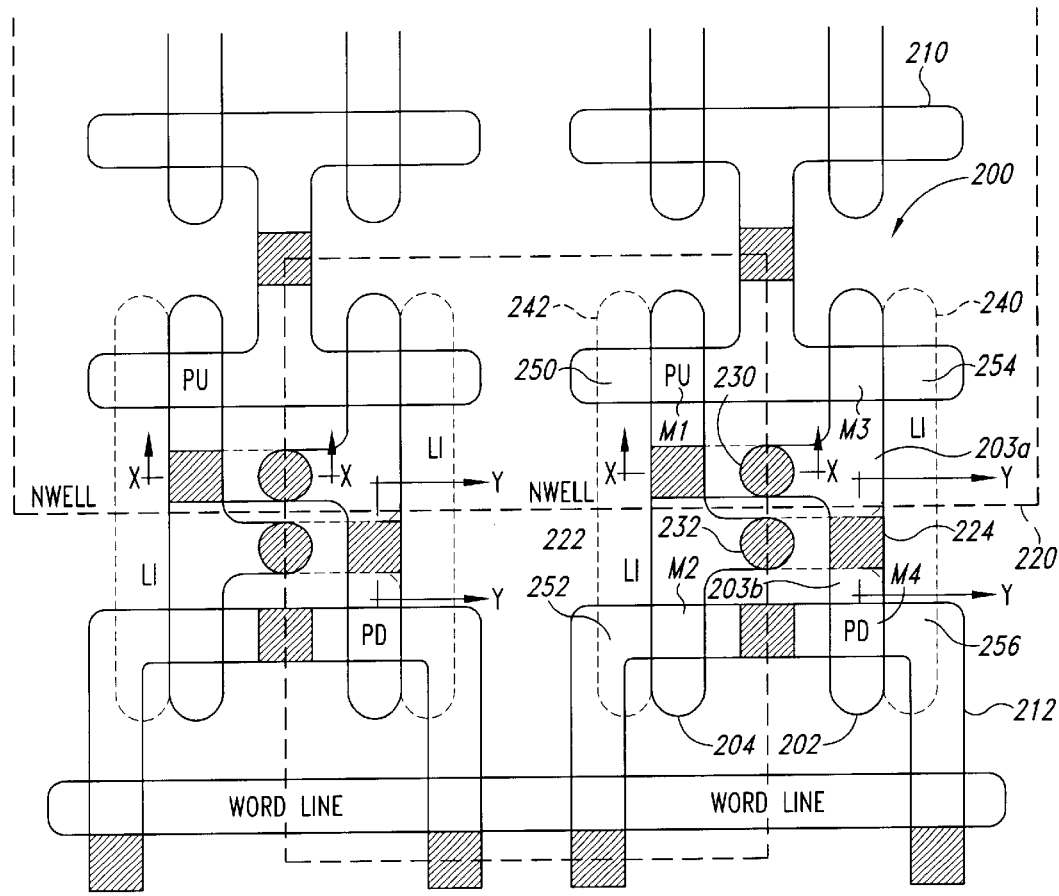

FIGS. 2a–2c illustrate an embodiment of the present invention as applied to an SRAM cell 200. Specifically, FIG.

2c illustrates a SRAM cell layout incorporating strap layer cuts 222 and 224 that reduce dopant cross-diffusion in dual-polycide structures. With respect to the SRAM cell 200, the dual-polycide structures represent the gates 202 and 204 of the cross-coupled CMOS inverters. FIGS. 2a and 2b illustrate cross-sectional views of the SRAM cell 200 at the locations indicated in FIG. 2c. A more detailed explanation of the formation of the dual-polycide structures of the SRAM cell 200 will be provided below with respect to FIGS. 3–6. It will be appreciated that the lateral sizes and thickness of the various layers illustrated in the accompanying figures are not drawn to scale and these various layers or layer portions may have been enlarged or reduced to improve drawing legibility. It will be further appreciated that in the following description, many of the processing steps discussed are understood by those of ordinary skill in the art, and detailed descriptions thereof have been omitted for the purposes of unnecessarily obscuring the present invention.

Figure 3A:
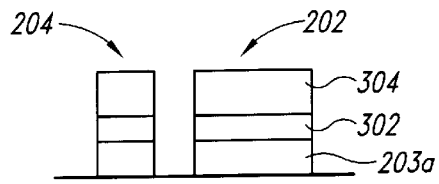
FIGS. 3a–3c are cross-sectional drawings and a corresponding layout drawing of the SRAM cell of FIGS. 2a–2c during the processing thereof.
Figure 3B:
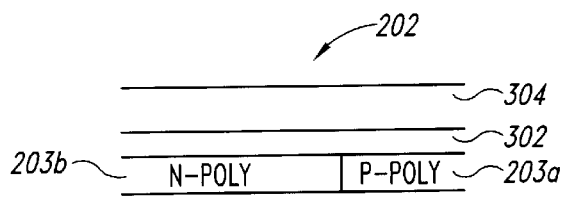
Figure 3C:
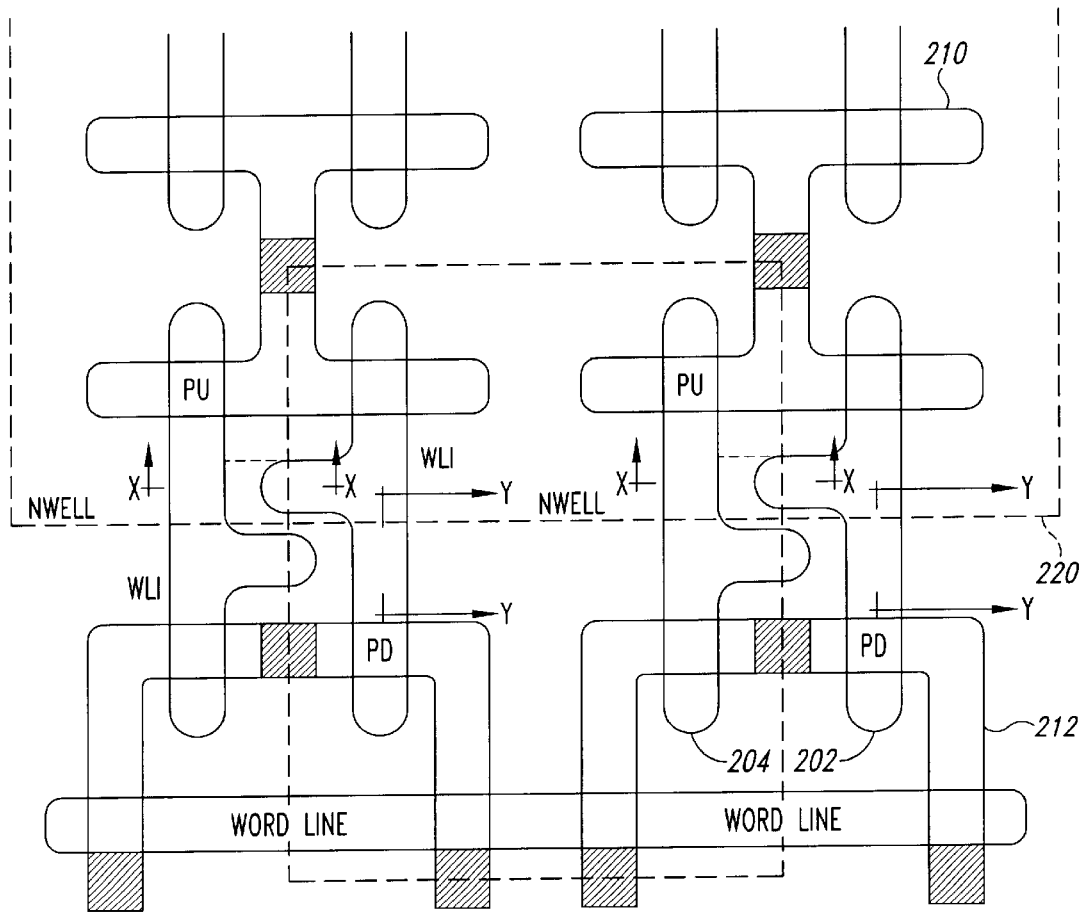

FIGS. 3a and 3b illustrate cross-sectional views, and FIG. 3c the corresponding layout, of the SRAM cell 200 following the formation of the dual-polycide gates 202 and 204. As shown in FIG. 3c, conventional active regions 210 and 212 are formed prior to the formation of the gates 202 and 204 in the SRAM cell 200. Additionally, a conventional n-well region 220 is formed prior to the gates 202 and 204 as well. It will be appreciated that the formation of the active regions 210 and 212, the n-well region 220, as well as other structures, such as oxide isolation regions, contact regions, and doped regions, are understood in the art and do not need to be described in greater detail herein in order to practice the invention.

The structure following a gate etch is illustrated in FIGS. 3a and 3b. FIGS. 3a and 3b show in greater detail the structure of the dual-polycide gates 202 and 204. Each of the gates includes a polysilicon layer 203 and a tungsten silicide (WSi) layer 302 used as a strap layer. A tetraethyl orthosilicate (TEOS) glass layer 304 is formed over the WSi layer 302 as a cap layer for the gates 202 and 204. Note that the dual doping of the polysilcon layer 203 for the gate 202 is apparent in FIG. 3b. Each of the gates 202 and 204 have a p-poly portion 203a that overlies the n-well region 220 and which is doped with a p-type dopant. The p-poly portions represent the gates for the p-channel pull-up transistors M1 or M3. The gates 202 and 204 further have an n-poly portion 203b that is doped with a n-type dopant, and represent the gates for the n-channel pull-down transistors M2 or M4. As mentioned previously, a junction diode is formed by the junction of the p-poly and n-poly portions 203a and 203b, thus, necessitating a conductive strap layer which is formed from the WSi layer 302.

Figure 4A:
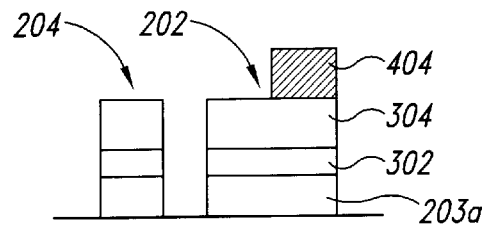
FIGS. 4a and 4b are cross-sectional drawings of the SRAM cell of FIGS. 2a and 2b during the processing thereof.
Figure 4B:
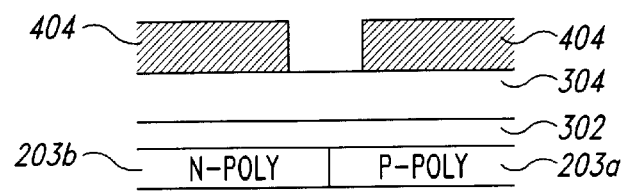

FIGS. 4a and 4b illustrate cross-sectional views following masking steps for the formation of exhumed contacts (EC) 230 and 232 (FIG. 2c). As used herein, the term masking steps include various conventional processing steps, including applying photoresist (PR), exposing the PR, and developing the PR. The process of masking is well known in the art, and will not be discussed in any greater detail for the sake of brevity. In the embodiment of the invention presently being discussed, strap cut regions 222 and 224 are formed concurrently with the exhumed contacts 230 and 232. As illustrated in FIGS. 4a and 4b, regions uncovered by photoresist 404 will be removed in a subsequent etch process forming the strap cut regions 222 and 224 and the exhumed contacts 230 and 232 (FIG. 2c). An advantage provided by this embodiment is that no additional steps need to be incorporated into the conventional fabrication process of an SRAM cell to employ the strap cuts according to the present invention. However, it will be appreciated that the mask for the exhumed contacts 230 and 232 will need to be modified to include the strap cut regions 222 and 224 for the present embodiment.

Figure 5A:
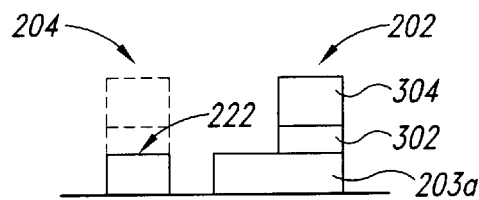
FIGS. 5a–5c are cross-sectional drawings and a corresponding layout drawing of the SRAM cell of FIGS. 2a–2c during the processing thereof.
Figure 5B:
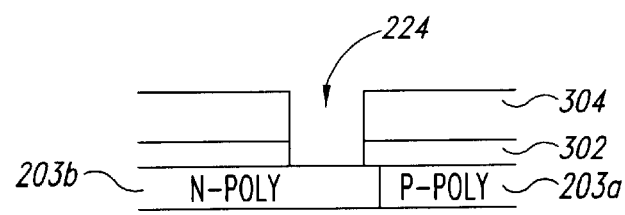
Figure 5C:
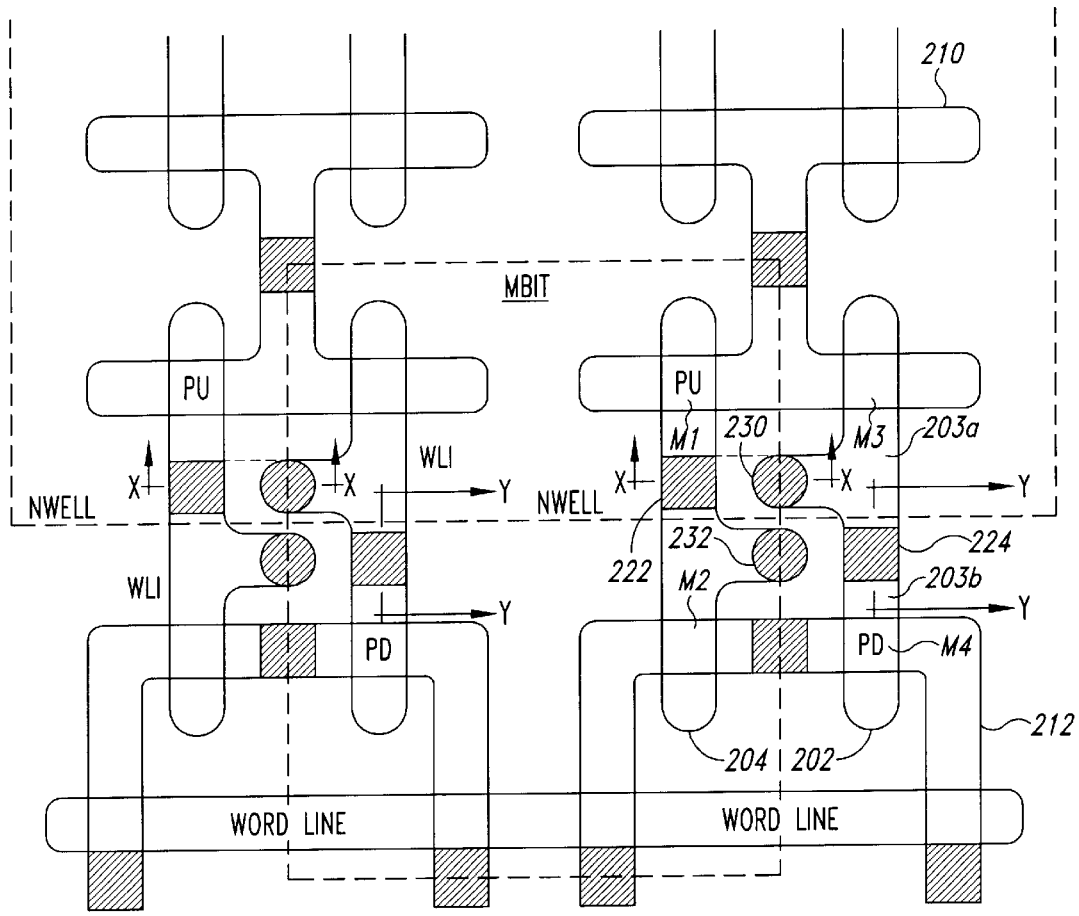

FIGS. 5a and 5b illustrate cross-sectional views, and FIG. 5c illustrates a the corresponding layout, following an etching step to form the exhumed contacts 230 and 232 and the strap cut regions 222 and 224. Typically, the EC etch is selective to polysilicon, and consequently, the TEOS and WSi layers are removed during the etch process. As shown in FIG. 5a, the etch step removes portions of TEOS and WSi layers 304 and 302 to expose a portion of the polysilicon layer 203a for the formation of the exhumed contact 230. The strap cut region 222 is formed by the etch step as well. The TEOS and WSi layers that are positioned above the polysilicon layer of the gate 204 in FIG. 5a represent a surface located at a different depth than at which the cross-sectional view of FIG. 5a is taken. However, the TEOS and WSi layers have been shown for clarity.

FIG. 5b illustrates the result of the EC etch along the gate 202. Portions of the TEOS and WSi layers 304 and 302 are removed to form the strap cut region 224, thereby exposing a region of the n-poly portion 203b. Significantly, the strap cut region 224 is offset from the junction of the p-poly and n-poly portions 203a and 203b such that the WSi strap layer 302 still provides a low resistance current path across the junction. However, because of the discontinuity in the WSi layer 302 created by the strap cut region 224, the cross-diffusion of dopants is reduced compared to a conventional strap layer where the layer of conductive material is continuous. That is, by reducing the length of overlap of the WSi strap layer 302 across the junction of the p-poly and n-poly portions 203a and 203b, the degree of dopant cross-diffusion can be reduced, thus, reducing adverse effects caused by the cross-diffusion.

Following the etching of the exhumed contacts 230 and 232, and the strap cut regions 222 and 224, the formation of conventional sidewalls or spacers is performed. The spacers are used as masks for device implant steps, such as the formation of lightly doped drain (LDD) regions, and further to electrically isolate the polysilicon and WSi of the gates 202 and 204 from conductive local interconnects that are formed in subsequent steps. The process by which the spacers are formed are well known in the art. One common manner in which the insulative spacers are formed includes a silicon nitride SiN deposition step followed by an anisotropic etch.

Figure 6A:
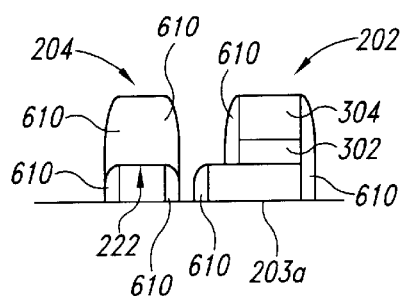
FIGS. 6a and 6b are cross-sectional drawings of the SRAM cell of FIGS. 2a and 2b during the processing thereof.
Figure 6B:
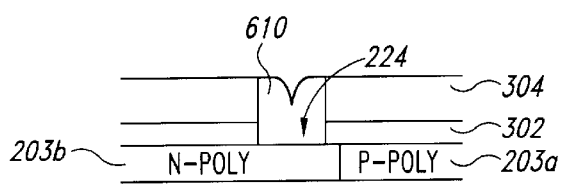

FIGS. 6a and 6b illustrate cross-sectional views of the SRAM 200 following the formation of the spacers. As illustrated in FIG. 6a, spacers 610 are formed along the vertical surfaces of the structures of the gates 202 and 204. With respect to the gate 204, the spacers insulate the polysilicon and WSi layers 203. However, with respect to the gate 202, although the WSi layer 302 is insulated, an upper surface of the polysilicon layer 203a of the gate 202 remains exposed for electrical contact with a subsequently formed conductive local interconnect. As illustrated in FIG. 6b, the spacer 610 is formed within the strap cut region 224 to insulate the exposed portion of the n-poly portion 203b. It will be appreciated that the depth of any cleft formed in the spacer 610 can be adjusted by different means. For example, the width and depth of the strap cut region 224 can be modified, as well as the thickness of the deposited SiN layer and the amount of etchback to adjust the spacer 610.

Figure 1A:
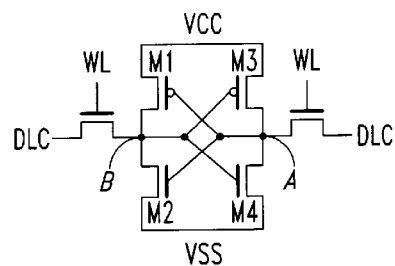
FIGS. 1a–1c are schematic drawings of a conventional SRAM cell, a layout view, and a cross-sectional view of the conventional SRAM cell.
Figure 1B:
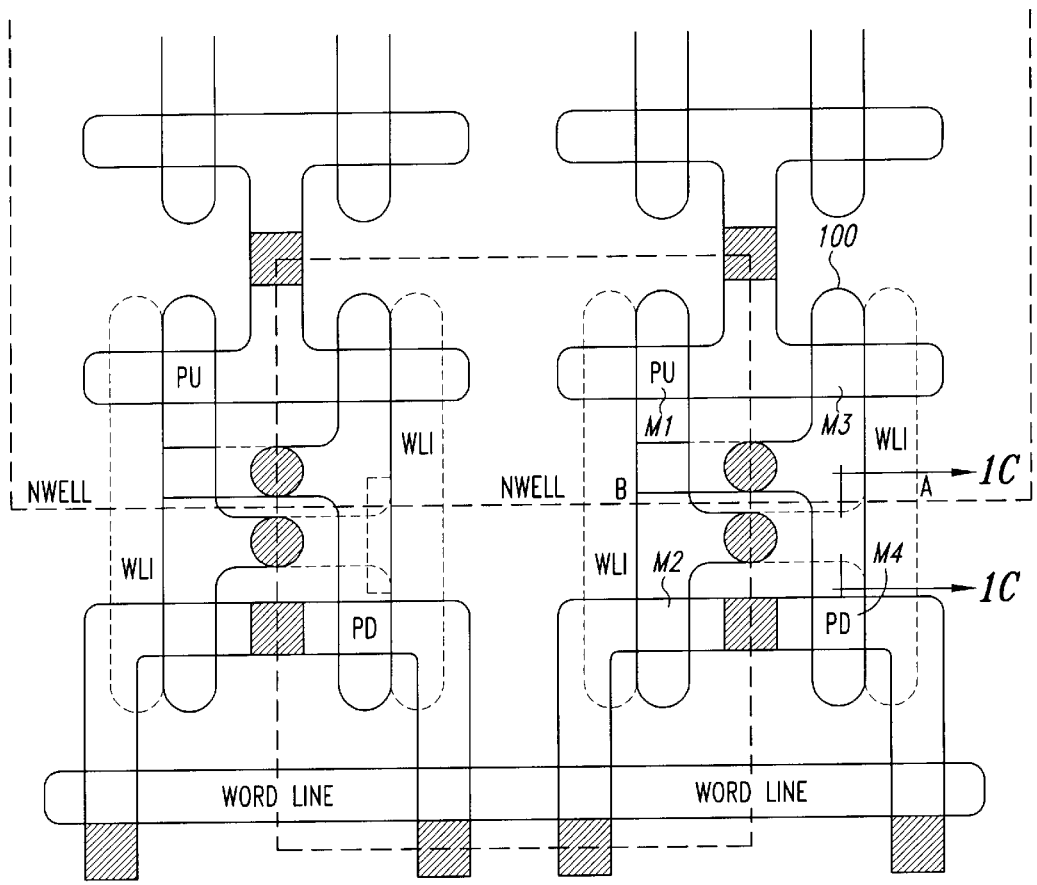
Figure 1C:
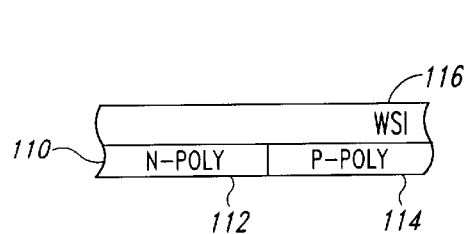

After the spacers 610 are formed, conductive local interconnects (LI) are formed to electrically couple various regions of the SRAM cell 200. Cross-sectional views of the resulting semiconductor structure are illustrated in FIGS. 2a and 2b, and the corresponding layout is illustrated in FIG. 2c. The local interconnect 240 couples the gate 204 to the active regions 210 and 212 at regions 254 and 256, respectively, and represents the node A as indicated in the schematic shown in FIG. 1a. The local interconnect 242 couples the gate 202 to the active regions 210 and 212 at regions 250 and 252, respectively, and represents the node B as indicated in the same schematic. The local interconnects are typically formed from a conductive material such as tungsten.

It will be appreciated that the detailed description provided herein is sufficient to allow a person of ordinary skill to practice the present invention. Moreover, although embodiments of the present invention have been described with respect to an SRAM cell, some or all of the principles of the present invention can be applied to various semiconductor structures where a dual-polycide structure is desired.

Figure 7:
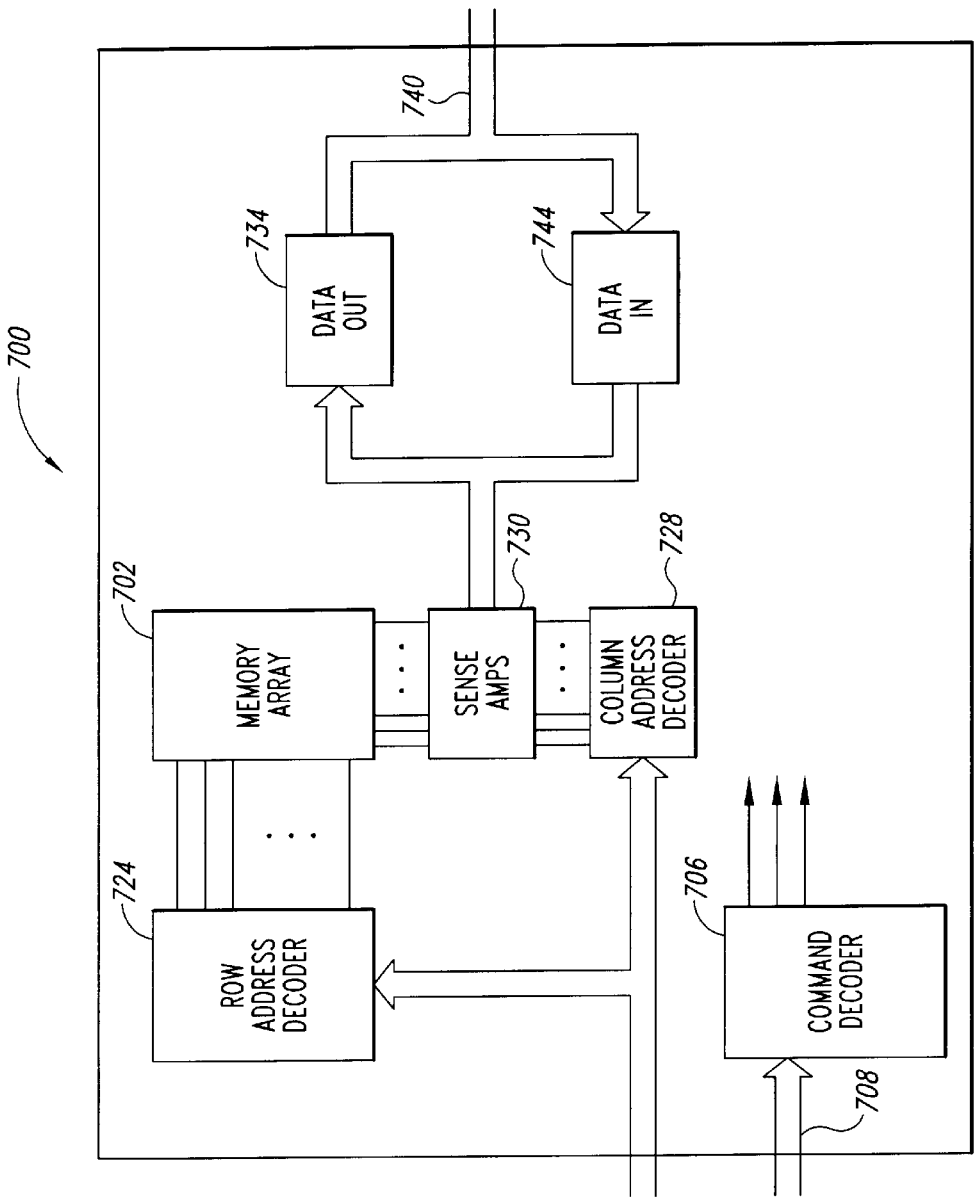
FIG. 7 is a block diagram of a typical memory device that includes one or more dual-polycide structures according to an embodiment of the present invention.

A memory device 700 that uses memory array 702 having dual-polycide structures according to one embodiment of the invention is shown in FIG. 7. The memory device 700 includes a command decoder 706 that receives memory command through a command bus 708 and generates corresponding control signals. A row or column address is applied to the memory device 700 through an address bus 720 and is decoded by a row address decoder 724 or a column address decoder 728, respectively. Sense amplifiers 730 are coupled to the array 702 to provide read data to a data output buffer 734 that, in turn, applies the read data to a data bus 740. Write data are applied to the memory array through a data input buffer 744. The buffers 734, 744 comprise a data path.

Figure 8:
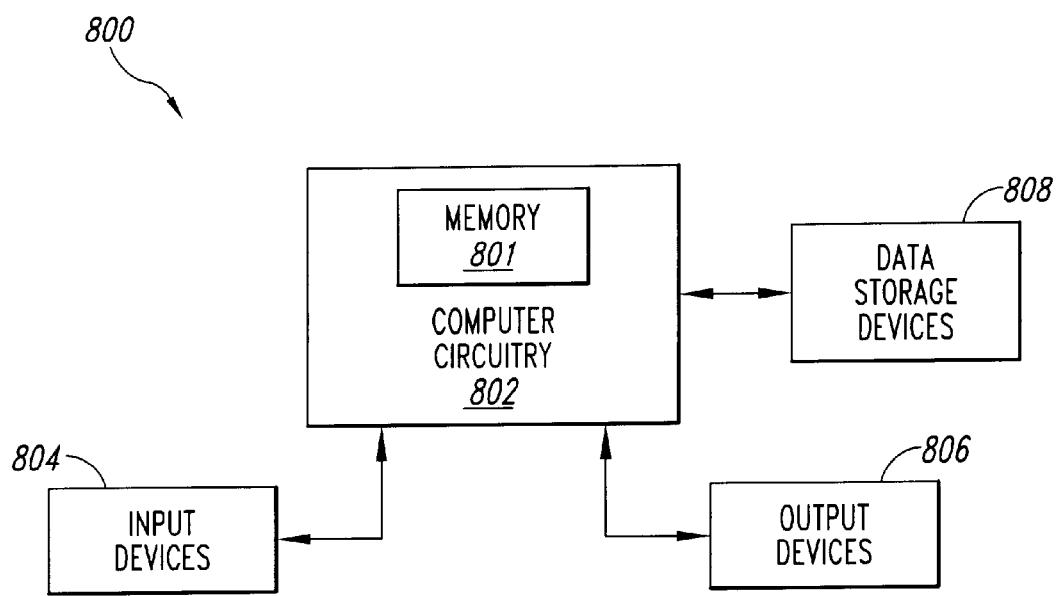
FIG. 8 is a functional block diagram of a computer system including a memory device having one or more dual-polycide structures according to an embodiment of the present invention.

FIG. 8 is a block diagram of a computer system 800 including computing circuitry 802. The computing circuitry 802 contains a memory 801 having dual-polycide structures according to embodiments of the present invention. The computing circuitry 802 performs various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. Typically, the computer system 800 also includes one or more output devices 806 coupled to the computer circuitry 802, such output devices typically being a printer or a video terminal. One or more data storage devices 808 are also typically coupled to the computer circuitry 802 to store data or retrieve data from external storage media (not shown). Examples of typical storage devices 808 include hard and floppy disks, tape cassettes, and compact disc read-only memories (CD-ROMs). The computer circuitry 802 is typically coupled to the memory device 801 through appropriate address, data, and control busses to provide for writing data to and reading data from the memory device.

It will be further appreciated that, although specific embodiments of the invention have been described herein for purposes of illustration, various modifications may be made without deviating from the spirit and scope of the invention. For example, embodiments of the present invention have been described as forming the strap cut regions 222 and 224 during an EC etch which is performed subsequent to the formation of the gates 202 and 204. However, it will be appreciated that the EC etch and the formation of the strap cut regions 222 and 224 can be performed prior to the gate formation as well. Additionally, the formation of the strap cut regions 222 and 224 can be performed independently of the EC etch step without departing from the scope of the present invention as well. Accordingly, the invention is not limited except as by the appended claims.

What is claimed is:

1. A method for forming a dual-polycide gate including a polysilicon layer having a first region doped with a first dopant and a second region adjoining the first region at an interface doped with a second dopant, the method comprising:
    forming a silicide layer over the polysilicon layer and overlaying the interface; and
    removing a portion of the silicide layer to form a region of discontinuity located away from the interface.

2. The method of claim 1 wherein removing a portion of the silicide layer comprises removing a portion of the silicide layer in proximity to the interface.

3. The method of claim 1 wherein removing a portion of the silicide layer comprises removing a portion of the silicide layer located over first region of the polysilicon layer.

4. A method for forming a polycide gate, comprising:
    forming a polysilicon layer;
    doping a first region of the polysilicon layer with a first dopant;
    doping a second region of the polysilicon layer with a second dopant, the second region adjoining the first region at an interface;
    forming a silicide layer over the polysilicon layer and overlaying the interface; and
    removing a portion of the silicide layer to form a region of discontinuity located away from the interface.

5. The method of claim 4 wherein removing a portion of the suicide layer comprises removing a portion of the silicide layer proximate to the interface.

6. The method of claim 4, further comprising forming a first insulating layer over the silicide layer through which the portion of the silicide layer is removed.

7. The method of claim 4 wherein forming a silicide layer comprises forming a layer of tungsten silicide.

8. The method of claim 6 wherein removing a portion of the silicide layer exposes a portion of the polysilicon layer, and the method further comprises forming a second insulating layer over the exposed portion of the polysilicon layer.

9. The method of claim 6, further comprising forming a contact hole through the first insulating layer to expose at least a portion of the polysilcon layer.

10. The method of claim 9 wherein forming the contact hole and removing a portion of the silicide layer are concurrent.

11. The method of claim 6, further comprising forming an conductive layer over the first insulating layer and in the contact hole to electrically couple the polysilicon layer.

12. A method for forming a dual-polycide gate having polysilicon layer and a silicide layer formed thereover, the method comprising:
    doping a first region of the polysilicon layer with a first dopant;
    doping a second region of the polysilicon layer with a second dopant, the second region adjoining the first region at an interface; and
    removing a portion of the silicide layer to form a region of discontinuity located away from the interface.

13. The method of claim 12 wherein doping the first region comprises doping the first region with a p-type dopant and doping the second region comprises doping the second region with an n-type dopant.

14. The method of claim 12 wherein removing a portion of the silicide layer comprises removing a portion of the silicide layer in proximity to the interface.

15. The method of claim 12 wherein removing a portion of the suicide layer comprises removing a portion of the silicide layer located over first region of the polysilicon layer.

16. A method for memory cell having a dual-polycide gate having polysilicon layer and a silicide layer formed thereover, the method comprising:

doping a first region of the polysilicon layer with a first dopant;

doping a second region of the polysilicon layer with a second dopant, the second region adjoining the first region at an interface; and removing a portion of the silicide layer to form a region of discontinuity located away from the interface.

17. The method of claim 16, further comprising forming a first insulating layer over the silicide layer through which the portion of the silicide layer is removed.

18. The method of claim 17 wherein removing a portion of the silicide layer exposes a portion of the polysilicon layer, and the method further comprises forming a second insulating layer over the exposed portion of the polysilicon layer.

19. The method of claim 17, further comprising forming a contact hole through the first insulating layer to expose at least a portion of the polysilcon layer.

20. The method of claim 19 wherein forming the contact hole and removing a portion of the silicide layer are performed concurrent.

21. The method of claim 17, further comprising forming an conductive layer over the first insulating layer and in the contact hole to electrically couple the polysilicon layer.

* * * * *

UNITED STATES PATENT AND TRADEMARK OFFICE
CERTIFICATE OF CORRECTION

PATENT NO. : 6,613,617 B2
DATED : September 2, 2003
INVENTOR(S) : Jigish D. Trivedi et al.

It is certified that error appears in the above-identified patent and that said Letters Patent is hereby corrected as shown below:

Column 2,
Line 41, "of a SRAM cell" should read -- of an SRAM cell --

Column 3,
Line 49, "thus, necessitating" should read -- thus necessitating --
Line 54, "steps include various" should read -- steps includes various --

Column 4,
Line 35, "thus, reducing" should read -- thus reducing --
Line 45, "formed are well known" should read -- formed is well known --
Line 54, "WSi layers 203." should read -- WSi layers 302. --

Column 5,
Line 24, "command through a" should read -- commands through a --

Column 6,
Line 19, "located over first" should read -- located over a first --
Line 34, "the suicide layer" should read -- the silicide layer --
Line 51, "forming an" should read -- forming a --
Line 54, "gate having" should read -- gate having a --

Column 7,
Line 5, "suicide layer comprises" should read -- silicide layer comprises --
Line 6, "located over first region" should read -- located over a first region --
Line 8, "method for memory cell" should read -- method for a memory cell --
Line 9, "having polysilicon layer" should read -- having a polysilicon layer --

UNITED STATES PATENT AND TRADEMARK OFFICE
CERTIFICATE OF CORRECTION

PATENT NO. : 6,613,617 B2
DATED : September 2, 2003
INVENTOR(S) : Jigish D. Trivedi et al.

It is certified that error appears in the above-identified patent and that said Letters Patent is hereby corrected as shown below:

<u>Column 8,</u>
Line 13, "formed concurrent." should read -- formed concurrently. --
Line 15, "an conductive layer" should read -- a conductive layer --

Signed and Sealed this

Twenty-ninth Day of June, 2004

JON W. DUDAS
*Acting Director of the United States Patent and Trademark Office*